United States Patent
Kitamura et al.

(10) Patent No.: US 12,027,367 B2
(45) Date of Patent: Jul. 2, 2024

(54) SUBSTRATE TREATMENT APPARATUS AND MANUFACTURING METHOD OF SEMICONDUCTOR DEVICE

(71) Applicant: Kioxia Corporation, Tokyo (JP)

(72) Inventors: Masayuki Kitamura, Yokkaichi (JP); Takayuki Beppu, Yokkaichi (JP); Tomotaka Ariga, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 109 days.

(21) Appl. No.: 17/452,125

(22) Filed: Oct. 25, 2021

(65) Prior Publication Data

US 2022/0044925 A1    Feb. 10, 2022

Related U.S. Application Data

(62) Division of application No. 16/567,269, filed on Sep. 11, 2019, now Pat. No. 11,189,489.

(30) Foreign Application Priority Data

Mar. 14, 2019 (JP) ................................. 2019-047313

(51) Int. Cl.
*H01L 21/02*     (2006.01)
*C23C 16/14*     (2006.01)
*C23C 16/44*     (2006.01)
*C23C 16/455*    (2006.01)
*H01L 21/28*     (2006.01)
*H01L 21/285*    (2006.01)
(Continued)

(52) U.S. Cl.
CPC .......... *H01L 21/0262* (2013.01); *C23C 16/14* (2013.01); *C23C 16/4408* (2013.01); *C23C 16/4412* (2013.01); *C23C 16/45534* (2013.01); *H01L 21/28556* (2013.01); *H01L 21/30604* (2013.01); *H01L 21/67253* (2013.01)

(58) Field of Classification Search
CPC .......... H01L 21/0262; H01L 21/67253; H01L 21/30604; H01L 21/28556; H01L 21/28562; H01L 21/32051; C23C 16/14
USPC .......................................................... 438/478
See application file for complete search history.

(56) References Cited

U.S. PATENT DOCUMENTS 6,143,081 A    11/2000 Shinriki et al.
6,485,564 B1   11/2002 Liu
(Continued)

FOREIGN PATENT DOCUMENTS

JP     10-79377 A      3/1998
JP     2003-218082 A   7/2003
(Continued)

*Primary Examiner* — Sheikh Maruf
(74) *Attorney, Agent, or Firm* — Oblon, McClelland, Maier & Neustadt, L.L.P.

(57) ABSTRACT

In a manufacturing method of a semiconductor device according to one embodiment, a first gas containing a first metal element is introduced into a chamber having a substrate housed therein. Next, the first gas is discharged from the chamber using a purge gas. Subsequently, a second gas reducing the first gas is introduced into the chamber. Next, the second gas is discharged from the chamber using the purge gas. Further, a third gas different from the first gas, the second gas, and the purge gas is introduced into the chamber at least either at a time of discharging the first gas or at a time of discharging the second gas.

3 Claims, 7 Drawing Sheets

(51) Int. Cl.
*H01L 21/306* (2006.01)
*H01L 21/67* (2006.01)

(56) References Cited

U.S. PATENT DOCUMENTS

| | | | |
|---|---|---|---|
| 7,037,560 B1 | 5/2006 | Shinriki et al. | |
| 7,125,799 B2 | 10/2006 | Aoyama et al. | |
| 7,611,751 B2 | 11/2009 | Elers | |
| 7,719,294 B1* | 5/2010 | Samsavar | G01R 31/303 324/754.21 |
| 7,994,054 B2 | 8/2011 | Sakata et al. | |
| 8,882,915 B2 | 11/2014 | Kato et al. | |
| 9,396,930 B2 | 7/2016 | Ohashi | |
| 10,541,265 B2 | 1/2020 | Okuyama | |
| 2002/0155695 A1 | 10/2002 | Lee | |
| 2003/0214039 A1 | 11/2003 | Yoon | |
| 2004/0048460 A1 | 3/2004 | Asahina | |
| 2004/0050326 A1 | 3/2004 | Thilderkvist | |
| 2004/0071897 A1* | 4/2004 | Verplancken | C23C 16/452 427/248.1 |
| 2004/0082251 A1 | 4/2004 | Bach | |
| 2004/0241991 A1 | 12/2004 | Aoyama | |
| 2005/0186793 A1 | 8/2005 | Omoto | |
| 2006/0006543 A1 | 1/2006 | Shimazu | |
| 2006/0086319 A1 | 4/2006 | Kasai | |
| 2006/0202336 A1 | 9/2006 | Kajita | |
| 2006/0205231 A1* | 9/2006 | Chou | H01L 21/0228 438/770 |
| 2006/0214305 A1 | 9/2006 | Sakata | |
| 2007/0259110 A1* | 11/2007 | Mahajani | H01J 37/32009 427/248.1 |
| 2008/0023838 A1 | 1/2008 | Sakata | |
| 2008/0067416 A1 | 3/2008 | Ranish | |
| 2008/0090410 A1 | 4/2008 | Sakata | |
| 2009/0238990 A1* | 9/2009 | Dasgupta | C23C 16/047 427/540 |
| 2009/0241232 A1* | 9/2009 | Mack | C23C 16/047 850/26 |
| 2009/0302433 A1 | 12/2009 | Yamazaki | |
| 2010/0219157 A1 | 9/2010 | Matsumoto | |
| 2011/0178628 A1 | 7/2011 | Gregor | |
| 2012/0100722 A1* | 4/2012 | Asai | H01L 21/0217 438/758 |
| 2012/0284882 A1* | 11/2012 | Mack | C23C 16/047 850/26 |
| 2013/0056036 A1 | 3/2013 | Tousimis | |
| 2013/0220221 A1 | 8/2013 | Sanchez | |
| 2013/0280911 A1 | 10/2013 | Kai | |
| 2015/0005955 A1 | 1/2015 | Gregor | |
| 2015/0005956 A1 | 1/2015 | Gregor | |
| 2015/0064361 A1 | 3/2015 | Greer et al. | |
| 2015/0303051 A1* | 10/2015 | Takeda | C23C 16/52 438/758 |
| 2015/0333006 A1 | 11/2015 | Sakata | |
| 2016/0284859 A1* | 9/2016 | Asami | H01L 29/7869 |
| 2016/0348234 A1 | 12/2016 | Suzuki et al. | |
| 2016/0365246 A1 | 12/2016 | Yamamoto | |
| 2016/0379879 A1 | 12/2016 | Hotta | |
| 2017/0011950 A1* | 1/2017 | Schmotzer | H01L 21/68757 |
| 2017/0256429 A1* | 9/2017 | Lawson | G05B 19/41885 |
| 2017/0271184 A1 | 9/2017 | Brashear | |
| 2017/0278705 A1* | 9/2017 | Murakami | C23C 16/45544 |
| 2017/0283942 A1 | 10/2017 | Suzuki | |
| 2017/0287778 A1* | 10/2017 | Okada | C23C 16/0272 |
| 2017/0323778 A1* | 11/2017 | Godet | H01L 21/3105 |
| 2018/0010247 A1* | 1/2018 | Niskanen | C23C 16/04 |
| 2018/0080121 A1* | 3/2018 | Longrie | C23C 16/56 |
| 2018/0315840 A1* | 11/2018 | Chui | H01L 21/0228 |
| 2018/0337040 A1* | 11/2018 | Kao | H01L 21/0228 |
| 2018/0363138 A1* | 12/2018 | Nakatani | H01L 21/02277 |

FOREIGN PATENT DOCUMENTS

| | | |
|---|---|---|
| JP | 2010-059492 A | 3/2010 |
| JP | 2010-508661 A | 3/2010 |
| JP | 2010-245448 A | 10/2010 |
| JP | 2010-272898 A | 12/2010 |
| JP | 2016-222954 A | 12/2016 |
| JP | 2017-186595 A | 10/2017 |
| WO | WO 2015/080058 A1 | 6/2015 |
| WO | WO 2015/097871 A1 | 7/2015 |

* cited by examiner

SUBSTRATE TREATMENT APPARATUS AND MANUFACTURING METHOD OF SEMICONDUCTOR DEVICE

CROSS-REFERENCE TO RELATED APPLICATIONS

This application is a division of U.S. application Ser. No. 16/567,269, filed Sep. 11, 2019, which is based upon and claims the benefit of priority from Japanese Patent Application No. 2019-047313, filed on Mar. 14, 2019; the entire contents of which are incorporated herein by reference.

FIELD

The embodiments of the present invention relate to a substrate treatment apparatus and a manufacturing method of a semiconductor device.

BACKGROUND

Manufacturing processes of a semiconductor device include a process of alternately and repeatedly flowing a material gas and a reducing gas to form a film on a substrate. In this process, by-products are generated by a chemical reaction between the material gas and the reducing gas. For example, there is a case where hydrogen fluoride (HF) adsorbs to the surface of the substrate due to a chemical reaction between tungsten hexafluoride ($WF_6$) and hydrogen ($H_2$). In this case, deposition of a film formation material is interrupted and the film formation speed may consequently decrease.

DETAILED DESCRIPTION

Embodiments will now be explained with reference to the accompanying drawings. The present invention is not limited to the embodiments.

In a manufacturing method of a semiconductor device according to one embodiment, a first gas containing a first metal element is introduced into a chamber having a substrate housed therein. Next, the first gas is discharged from the chamber using a purge gas. Subsequently, a second gas reducing the first gas is introduced into the chamber. Next, the second gas is discharged from the chamber using the purge gas. Further, a third gas different from the first gas, the second gas, and the purge gas is introduced into the chamber at least either at a time of discharging the first gas or at a time of discharging the second gas.

First Embodiment

Figure 1:
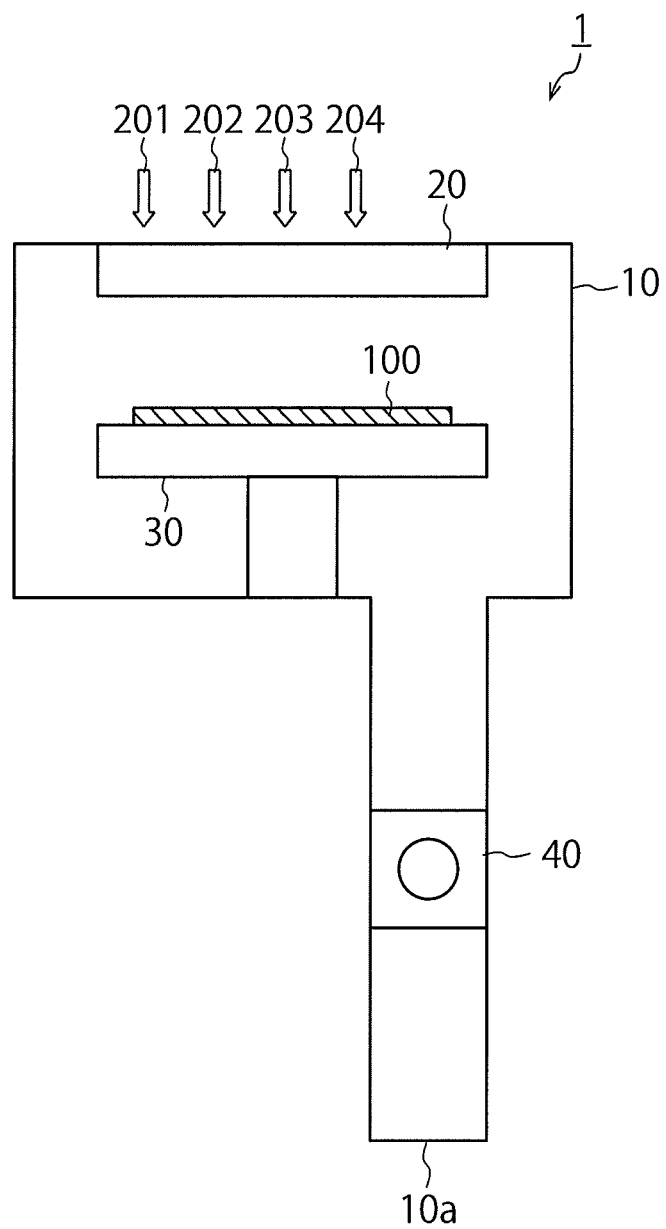
FIG. 1 is a schematic diagram illustrating a schematic configuration of a substrate treatment apparatus according to a first embodiment.

FIG. 1 is a diagram illustrating a schematic configuration of a substrate treatment apparatus according to a first embodiment. A substrate treatment apparatus 1 illustrated in FIG. 1 is a single-substrate film formation apparatus that forms a film on a substrate 100 by an ALD (Atomic Layer Deposition) method. The substrate treatment apparatus 1 includes a chamber 10, a head 20, a stage 30, and a dry pump 40.

The chamber 10 houses the head 20 and the stage 30 therein. The head 20 is placed on the upper surface of the chamber 10. The stage 30 is placed on the lower side of the head 20. The substrate 100 being a processing target is mounted on the stage 30. The substrate 100 is, for example, a substrate containing silicon. That is, the substrate 100 is also housed in the chamber 10.

Figure 2:
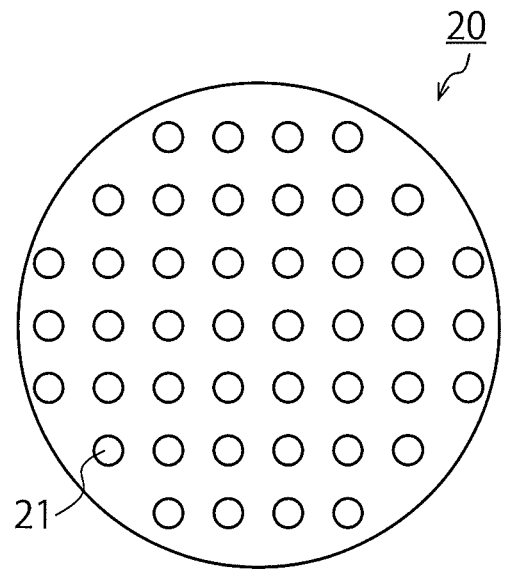
FIG. 2 is a diagram of a head viewed from the lower side according to the first embodiment.

FIG. 2 is a diagram of the head 20 viewed from the lower side, that is, the side of the stage 30. As illustrated in FIG. 2, a plurality of holes 21 are formed on the head 20. Various gases are introduced into the chamber 10 from the holes 21. In the present embodiment, a material gas 201, a reducing gas 202, a processing gas 203, and a purge gas 204 are supplied from outside the substrate treatment apparatus 1 and are introduced into the chamber 10 through the head 20 as illustrated in FIG. 1.

The material gas 201 is an example of a first gas containing a material (more specifically, a metallic element) of a film to be formed on the substrate 100. For example, the material gas 201 is a tungsten hexafluoride gas containing tungsten (W) as the metallic element. The reducing gas 202 is an example of a second gas that reduces the material gas 201. The reducing gas 202 is, for example, a hydrogen gas.

The processing gas 203 is an example of a third gas that breaks chemical bonds between a film formation material having adsorbed to the surface of the substrate 100 and by-products generated by a chemical reaction between the material gas 201 and the reducing gas 202. More specifically, the processing gas 203 breaks chemical bonds between a film of the metallic element formed on the substrate 100 and elements contained in the by-products described above. When the material gas 201 is a tungsten hexafluoride gas and the reducing gas 202 is a hydrogen gas, the by-products are, for example, fluorine or/and hydrogen fluoride. That is, the processing gas 203 breaks chemical bonds between tungsten and fluorine. Breaking of chemical bonds occurs due to elements having larger bond energy with fluorine being the by-products than tungsten, which are contained in the processing gas 203.

For example, a gas containing halogen can be used as the processing gas 203. In this case, the processing gas 203 contains, for example, hydrogen chloride (HCl), chlorine ($Cl_2$), boron trichloride ($BCl_3$), or hydrogen bromide (HBr). These gases may be introduced in a state heated to a temperature equal to or higher than deposition temperature. Heating provides energy equal to or larger than bond energy between tungsten and fluorine being the by-products and breaking of chemical bonds is more likely to occur.

A gas containing oxygen may also be used as the processing gas 203. In this case, the processing gas 203 contains, for example, oxygen molecules ($O_2$), carbon monoxide (CO), nitric monoxide (NO), nitrous oxide ($N_2O$), sulfuric acid ($H_2SO_4$), hydrogen peroxide ($H_2O_2$), nitrogen dioxide ($NO_2$), sulfur dioxide ($SO_2$), or carbonyl sulfide (COS). These gases may also be heated.

A gas in which carbon and hydrogen are chemically bonded to each other can be alternatively used as the processing gas 203. In this case, the processing gas 203 contains, for example, propylene ($C_3H_6$), acetylene ($C_2H_2$), or ethylene ($C_2H_4$). These gases may also be introduced in a heated state.

Furthermore, the processing gas 203 may contain, for example, ammonia ($NH_3$), hydrogen sulfide ($H_2S$), hydrogen phosphide ($PH_3$), arsenic hydride ($AsH_3$), or hydrogen selenide ($H_2Se$). These gases may also be introduced in a heated state.

The purge gas 204 is used at the time of discharging the material gas 201 and the reducing gas 202 from the chamber 10. An inert gas such as argon (Ar) or nitrogen can be used as the purge gas 204.

The stage 30 holds the substrate 100 in the chamber 10. The stage 30 has a heating function to heat the substrate 100. The dry pump 40 is placed on a lower part of the chamber 10. Gases floating in the chamber 10 are discharged by the dry pump from an outlet 10a provided on a bottom part of the chamber 10.

A manufacturing method of a semiconductor device using the substrate treatment apparatus 1 according to the present embodiment is explained below. A process of forming a tungsten film on the substrate 100 is explained here.

Figure 3:
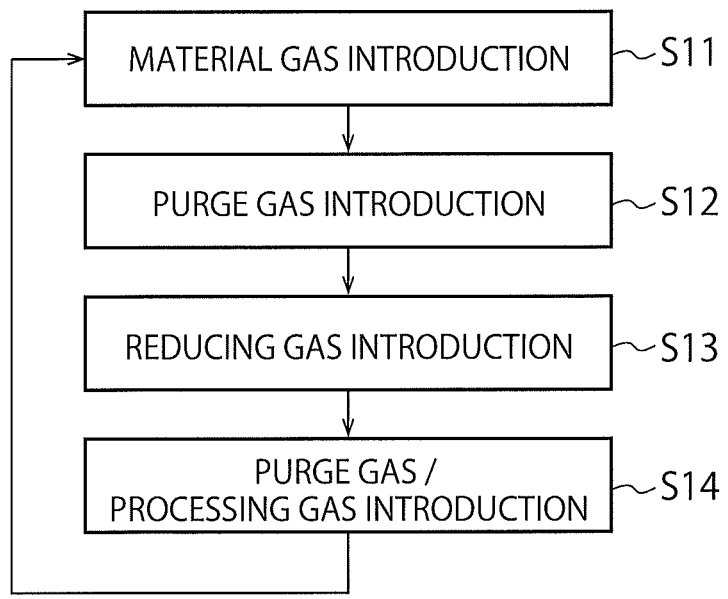
FIG. 3 is a flowchart illustrating a film formation process according to the first embodiment.
Figure 4A:
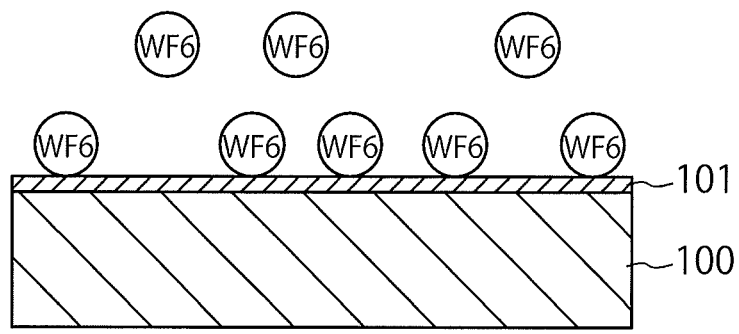
FIG. 4A illustrates a film formation state in a material-gas introduction process.
Figure 4B:
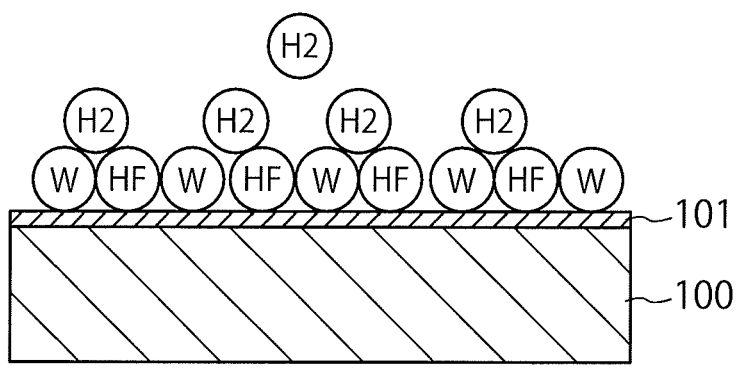
FIG. 4B illustrates a film formation state in a reducing-gas introduction process.
Figure 4C:
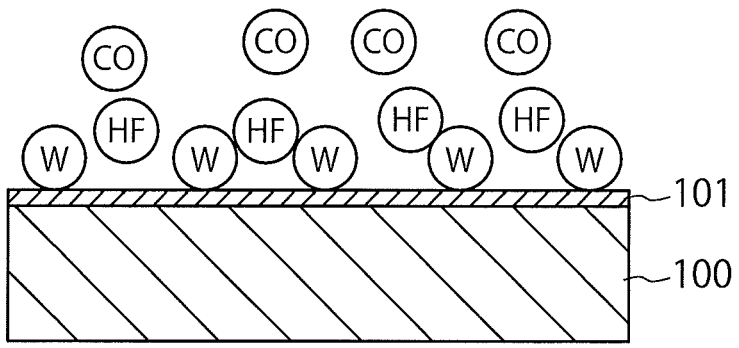
FIG. 4C illustrates a film formation state in a processing-gas introduction process.

FIG. 3 is a flowchart illustrating a film formation process according to the present embodiment. FIGS. 4A to 4C are schematic diagrams illustrating a film formation state of the substrate 100.

First, when the substrate 100 is heated to a film formation temperature by the heating function of the stage 30, the material gas 201 is introduced into the chamber 10 from the head 20 (Step S11). The material gas 201 contains tungsten hexafluoride ($WF_6$).

Next, the purge gas 204 is introduced into the chamber 10 from the head 20 (Step S12). At that time, the dry pump 40 is also driven. Accordingly, the material gas 201 floating in the chamber 10 is discharged from the outlet 10a of the chamber 10.

Next, the reducing gas 202 is introduced into the chamber from the head 20 (Step S13). In this example, the reducing gas 202 is a hydrogen gas. Introduction of the reducing gas 202 reduces tungsten hexafluoride and forms a film of tungsten.

Subsequently, the purge gas 204 is introduced again into the chamber 10 from the head 20 and the dry pump 40 is driven (Step S14). Accordingly, the reducing gas 202 floating in the chamber 10 is discharged from the outlet 10a of the chamber 10. At Step S14, the processing gas 203 is also introduced into the chamber 10 from the head 20. In this example, the processing gas 203 is a carbon monoxide gas. In the process at Step S14, the purge gas 204 and the processing gas 203 may be introduced into the chamber 10 at the same time. Alternatively, the processing gas 203 can be introduced after the purge gas 204 is introduced. Further, heated purge gas 204 may be introduced.

In the present embodiment, Steps S11 to S14 described above are sequentially repeated. Therefore, at second and subsequent Steps S11, tungsten hexafluoride adsorbs to a tungsten film 101 formed on the substrate 100 as illustrated in FIG. 4A.

At second and subsequent Steps S13, tungsten hexafluoride having adsorbed to the tungsten film 101 and hydrogen contained in the reducing gas 202 chemically react with each other according to a chemical formula represented by the following formula (1).

$$WF_6+3H_2 \rightarrow W+6HF \qquad (1)$$

As a result of the above chemical reaction, tungsten hexafluoride is reduced on the tungsten film 101 to form a tungsten film 101 as illustrated in FIG. 4B. At the same time, hydrogen fluoride (HF) is generated as by-products and adsorbs to the tungsten film 101. Fluorine having adsorbed to the tungsten film 101 acts as a film formation inhibitor.

It is preferable that the hydrogen fluoride described above be removed by the purge gas 204 introduced at the subsequent Step S14. However, it is difficult to remove all hydrogen fluoride having adsorbed to the tungsten film 101 only with the purge gas 204 and some hydrogen fluoride remain on the tungsten film 101.

Therefore, in the present embodiment, a carbon monoxide gas being the processing gas 203 is also introduced into the chamber 10 at the time of introducing the purge gas 204 or after the introduction thereof. This breaks the chemical bonds between tungsten and fluorine and promotes desorption of hydrogen fluoride as illustrated in FIG. 4C.

According to the present embodiment described above, the processing gas 203 breaks chemical bonds between a film formation material (tungsten) having adsorbed to the surface of the substrate 100 and by-products (hydrogen fluoride) generated by a chemical reaction between the material gas 201 and the reducing gas 202. Because this promotes desorption of substances (fluorine) interrupting formation of the tungsten film 101, the film formation speed of the tungsten film 101 can be increased. The tungsten film 101 can be applied to, for example, word lines or interconnections in a three-dimensional semiconductor memory having stacked memory cells.

In the present embodiment, the processing gas 203 is introduced at the time of discharging the reducing gas 202 (Step S14). However, when by-products containing substances that interrupt film formation are generated after the introduction of the material gas 201, the processing gas 203 may be introduced at the time of discharging the material gas 201 (Step S12).

The processing gas 203 may be introduced both at the time of discharging the reducing gas 202 and at the time of discharging the material gas 201 when by-products are respectively generated after the introduction of the material gas 201 and after the introduction of the reducing gas 202. That is, it suffices to introduce the processing gas 203 into the chamber 10 at least either at the time of discharging the reducing gas 202 or at the time of discharging the material gas 201 according to generation situations of by-products that interrupt film formation.

Second Embodiment

Figure 5:
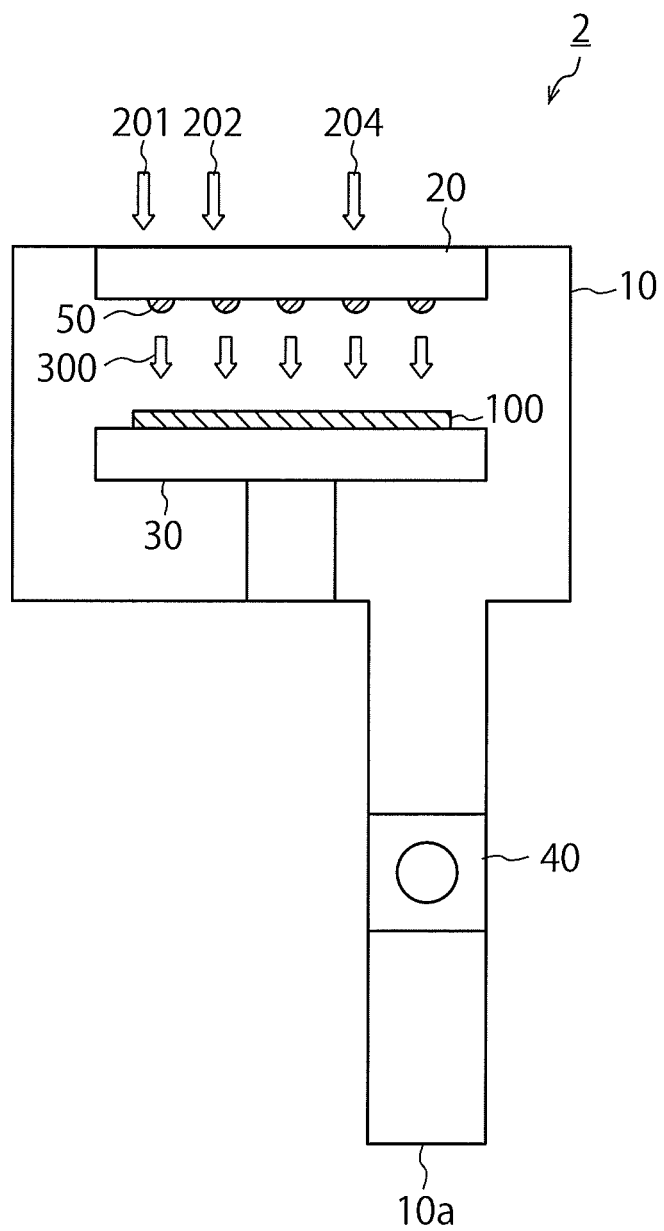
FIG. 5 is a diagram illustrating a schematic configuration of a substrate treatment apparatus according to a second embodiment.

FIG. 5 is a diagram illustrating a schematic configuration of a substrate treatment apparatus according to a second embodiment. Constituent elements identical to those of the substrate treatment apparatus 1 according to the first embodiment illustrated in FIG. 1 are denoted by like reference signs and detailed explanations thereof are omitted.

A substrate treatment apparatus 2 according to the present embodiment includes a plurality of light sources 50 in addition to the constituent elements of the substrate treatment apparatus 1 according to the first embodiment as illustrated in FIG. 5. The light sources 50 are placed on the head 20. For example, a light-emitting diode can be used as each of the light sources 50.

Figure 6:
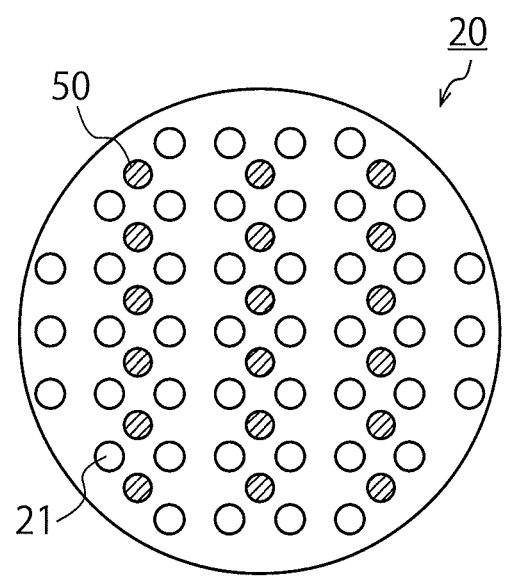
FIG. 6 is a diagram of a head viewed from the lower side according to the second embodiment.

FIG. 6 is a diagram of the head 20 illustrated in FIG. 5 viewed from the lower side. As illustrated in FIG. 6, the light sources 50 are arrayed in a matrix between the holes 21. However, arrangement of the light sources 50 is not limited to the layout illustrated in FIG. 6.

A manufacturing method of a semiconductor device using the substrate treatment apparatus 2 according to the present embodiment is explained below. Because a process of introducing the material gas 201 (Step S11), a process of introducing the purge gas 204 (Step S12), and a process of introducing the reducing gas 202 (Step S13) are identical to those in the first embodiment, detailed explanations thereof are omitted.

In the present embodiment, all the light sources 50 simultaneously irradiate lights 300 toward the substrate 100 at the time of introducing the purge gas 204, that is, at the time of discharging the reducing gas 202 or/and at the time of discharging the material gas 201. The lights 300 have larger energy than chemical bond energy between a material formed as a film on the substrate 100 and by-products having adsorbed to the material.

For example, when the film formation material is tungsten and the by-products are hydrogen fluoride, the wavelength of the lights 300 is 330 nanometers or shorter. A light has a property of having larger energy as the wavelength is shorter. Therefore, when the lights 300 having such a short wavelength are irradiated, chemical bonds between tungsten and fluorine are broken. As a result, desorption of hydrogen fluoride is promoted.

According to the present embodiment explained above, the lights 300 irradiated from the light sources 50 break chemical bonds between the film formation material (tungsten) having adsorbed to the surface of the substrate 100 and by-products (fluorine) generated by a chemical reaction between the material gas 201 and the reducing gas 202. Accordingly, desorption of substances (fluorine) that interrupt formation of the tungsten film 101 is promoted and thus the film formation speed of the tungsten film 101 can be increased.

In the present embodiment, the light sources 50 irradiate the lights 300 having the same wavelength at the same time. However, for example, when plural types of by-products that interrupt film formation are generated, the light sources 50 may irradiate plural types of lights having different wavelengths at the same time. In this case, most appropriate lights can be irradiated at the same time according to the types of by-products and thus the plural types of by-products can be removed by one light irradiation.

In the present embodiment, a purge step of introducing only the purge gas 204 into the chamber 10 may be added before the lights 300 are irradiated. At an initial time of the irradiation of the lights 300, the reducing gas 202 having been introduced at a step before the irradiation remains in the chamber. If the lights 300 are irradiated to the reducing gas 202, an unintended film formation reaction may occur. In this case, a situation where an uneven film is generated or particles are generated in the chamber 10 is envisaged. When the purge step described above is added, such a situation can be avoided.

Third Embodiment

Figure 7:
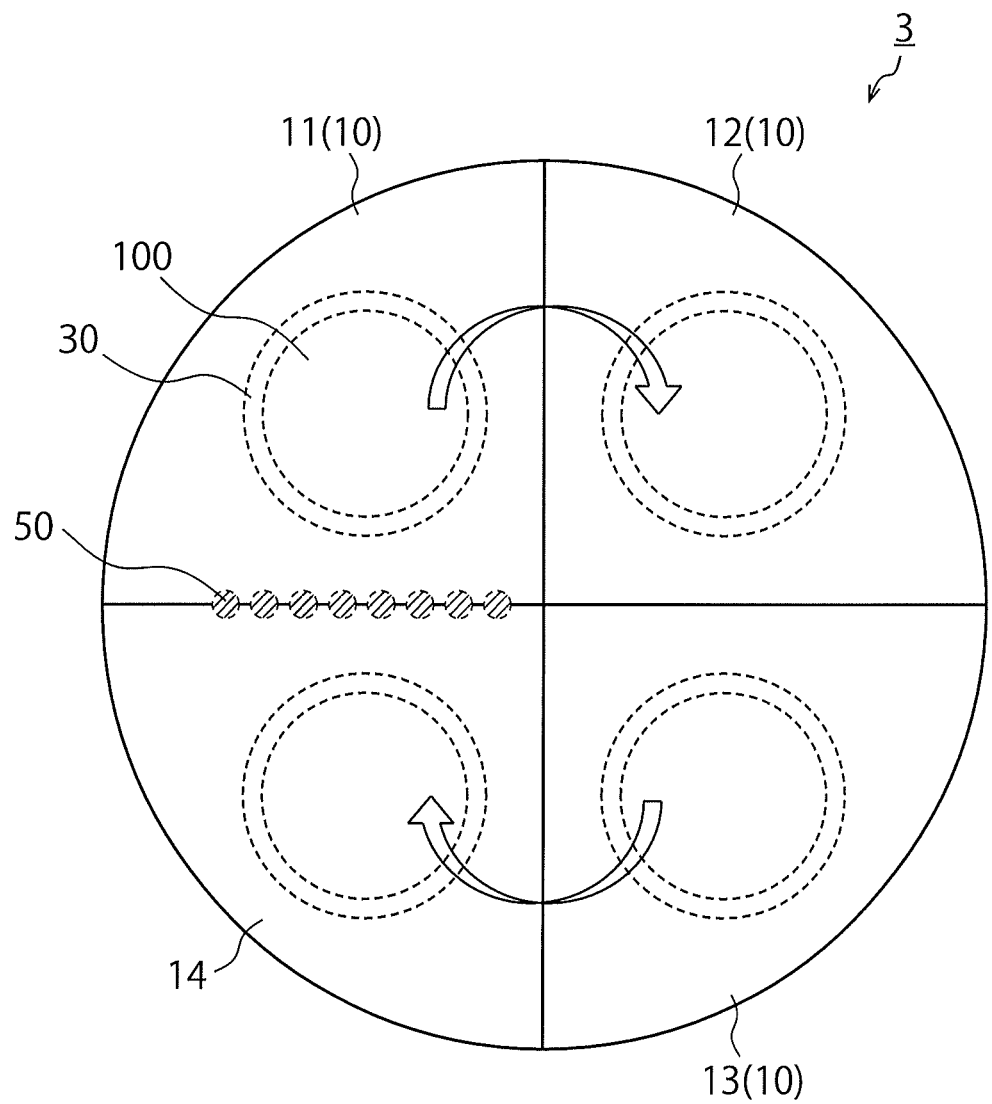
FIG. 7 is a plan view illustrating a schematic configuration of a substrate treatment apparatus according to a third embodiment.
Figure 8:
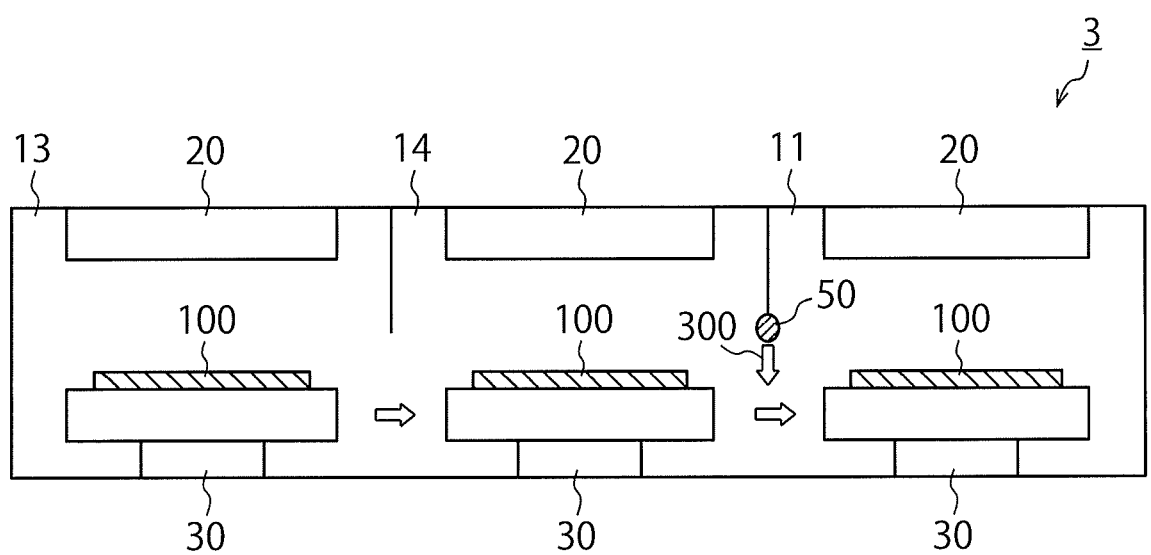
FIG. 8 is a side view illustrating a schematic configuration of the substrate treatment apparatus according to the third embodiment.

FIG. 7 is a plan view illustrating a schematic configuration of a substrate treatment apparatus according to a third embodiment. FIG. 8 is a side view illustrating a schematic configuration of the substrate treatment apparatus according to the third embodiment. Different points from the substrate treatment apparatus 2 according to the second embodiment described above are mainly explained below.

In a substrate treatment apparatus 3 according to the present embodiment, the chamber 10 being circular in a planar view is divided into four parts, that is, a material-gas flow chamber 11, a purge chamber 12, a reducing-gas flow chamber 13, and a purge chamber 14. The material-gas flow chamber 11 is an example of a first chamber into which the material gas 201 is introduced. The purge chamber 12 is an example of a second chamber that is adjacent to the material-gas flow chamber 11 and into which the purge gas 204 is introduced. The reducing-gas flow chamber 13 is an example of a third chamber that is adjacent to the purge chamber 12 and into which the reducing gas 202 is introduced. The purge chamber 14 is an example of a fourth chamber that is adjacent to the reducing-gas flow chamber 13 and the material-gas flow chamber 11 and into which the purge gas 204 is introduced. The heads 20 are placed on upper parts of the material-gas flow chamber 11 to the purge chamber 14, respectively. The gases are introduced from these heads 20 into the corresponding chambers, respectively.

In the substrate treatment apparatus 3, a plurality of the stages 30 can rotationally move around the center of the chamber from the material-gas flow chamber 11 to the purge chamber 14. Accordingly, the substrates 100 respectively mounted on the stages 30 can be carried from the material-gas flow chamber 11 to the purge chamber 14 in sequence.

Furthermore, in the substrate treatment apparatus 3, a plurality of the light sources 50 are placed on a boundary portion between the purge chamber 14 and the material-gas flow chamber 11. The light sources 50 always emit the lights 300. The light sources 50 may be placed on the head 20 of the purge chamber 14.

In a film formation process using the substrate treatment apparatus 3 configured as described above, introduction of the material gas 201, introduction of the reducing gas 202, and introduction of the purge gas 204 are performed in different processing chambers, respectively. Accordingly, flow of the material gas 201 and the reducing gas 202 into the purge chambers 12 and 14 can be avoided and thus stability of the film formation process is improved.

In a case where introductions of the material gas 201, the reducing gas 202, and the purge gas 204 are performed in one processing chamber, irradiation of the lights 300 by the light sources 50 is required only at the time of the introduction of the purge gas 204. Therefore, the light sources 50 need to be quickly switched between on and off. In this case, the light intensity of the light sources 50 is limited.

However, in the present embodiment, introduction of the purge gas 204 is performed independently in the purge chamber 14 and therefore the light sources 50 can be kept always on. Because this can eliminate the need of switching control of the light sources 50 between on and off, the light sources 50 can irradiate the lights 300 with a higher light intensity. As a result, bonds between tungsten and fluorine can be more reliably broken.

Fourth Embodiment

A substrate treatment apparatus used in the present embodiment is identical to the substrate treatment apparatus 1 according to the first embodiment illustrated in FIG. 1 and detailed explanations thereof are omitted. Here, different points from the first embodiment are mainly explained.

The processing gas 203 used in the present embodiment is a rare gas heated to a temperature equal to or higher than a film formation temperature at which the tungsten film 101 is formed on the substrate 100. Specifically, the processing gas 203 is a rare gas containing helium (He), argon (Ar), krypton (Kr), or xenon (Xe).

The processing gas 203 is introduced into the chamber 10 at the time of discharging the reducing gas 202 (Step S14) similarly to the first embodiment. Because the processing gas 203 is heated to a temperature equal to or higher than the film formation temperature, the heat energy breaks bonds between the tungsten film 101 and fluorine. Therefore, desorption of hydrogen fluoride generated by introductions of the material gas 201 and the reducing gas 202 from the tungsten film 101 can be promoted.

Also in the present embodiment, the processing gas 203 can be introduced into the chamber 10 at least either at the time of discharging the reducing gas 202 or at the time of discharging the material gas 201 according to generation situations of by-products that interrupt film formation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
   a chamber having a substrate housed therein;
   a head configured to repeatedly introduce a first gas containing a first metal element, a second gas reducing the first gas, and a purge gas into the chamber; and
   a light source configured to irradiate a specific light to the substrate at a time of introducing the purge gas,
   wherein the chamber is divided into a first chamber configured to introduce the first gas therein, a second chamber adjacent to the first chamber and configured to introduce the purge gas therein, a third chamber adjacent to the second chamber and configured to introduce the second gas therein, and a fourth chamber adjacent to the third chamber and the first chamber and configured to introduce the purge gas therein.

2. The apparatus of claim 1, further comprising a stage configured to move the substrate at least from the first chamber to the fourth chamber.

3. The apparatus of claim 2, wherein the light source is placed on a boundary portion between the fourth chamber and the first chamber.

* * * * *